United States Patent [19]

Johnson, Jr. et al.

[11] 4,158,203
[45] Jun. 12, 1979

[54] ARRANGEMENT FOR RECORDING IMAGES APPEARING ON A CATHODE RAY TUBE

[75] Inventors: Clark E. Johnson, Jr., Weston, Mass.; William F. Main, Coral Gables, Fla.

[73] Assignee: Buckeye International, Inc., Columbus, Ohio

[21] Appl. No.: 838,131

[22] Filed: Sep. 30, 1977

[51] Int. Cl.$^2$ .................... G01D 9/00; G01D 15/10
[52] U.S. Cl. ................... 346/35; 346/76 R
[58] Field of Search ........... 346/35, 76 R, 110; 358/127, 298; 360/32

[56] References Cited

U.S. PATENT DOCUMENTS

| | | | |
|---|---|---|---|
| 3,272,918 | 9/1966 | Koll et al. ................ | 358/298 X |
| 3,373,437 | 3/1968 | Sweet et al. ............. | 346/75 |
| 3,815,144 | 6/1974 | Aiken ...................... | 346/35 |
| 3,872,462 | 3/1975 | Lemelson ................ | 360/32 X |
| 3,975,761 | 8/1976 | Taudt et al. ............. | 360/32 X |
| 4,016,361 | 4/1977 | Pandey .................... | 358/127 X |
| 4,063,290 | 12/1977 | Metilda et al. .......... | 360/32 X |
| 4,071,849 | 1/1978 | Koyano et al. .......... | 346/76 R X |

*Primary Examiner*—George H. Miller, Jr.
*Attorney, Agent, or Firm*—Jacobs & Jacobs

[57] ABSTRACT

An arrangement for making a hard copy of a cathode ray tube display. Each horizontal line of a video signal is subdivided into a predetermined number of intervals. The amplitude of the video signal within each interval is digitized, and the digitized data, after being stored in a first-in-first-out shift register, is recorded on any desired recording medium, such as heat-sensitive or electro-sensitive paper. Each horizontal line is printed along a line on the paper, and the paper is advanced by one line when the next horizontal line of the video signal is ready to be recorded. The subdividing of each horizontal line is carried out by a phase-lock loop which functions as a frequency multiplier and provides a predetermined number of pulses for each horizontal sync pulse. Each horizontal line being processed is identified by a line counter to ensure that the horizontal lines of a frame are sequentially printed. The digitizing of the amplitude of the video signal permits printing of gray intensities of the video signal displayed on the cathode ray tube. A frequency-controlled oscillator provides image darkness by determining the duration of current applied to the printing element against the sensitive paper for recording the information taken from the shift register.

12 Claims, 5 Drawing Figures

ARRANGEMENT FOR RECORDING IMAGES APPEARING ON A CATHODE RAY TUBE

BACKGROUND OF THE INVENTION

In the use of cathode ray tube terminals, it is often desirable to record permanently images appearing on the cathode ray tube display. Whereas apparatus has been known, heretofore, for recording or printing of such images appearing on cathode ray tubes, such as U.S. Pat. Nos. 3,920,896, 3,958,088 and 3,725,900, these have been of complex construction requiring costly electronic components. Conventional apparatus for recording cathode ray tube displays, furthermore, do not make use of the precision which is inherent in and available from the video signal. The complexity of the conventional arrangements for printing or recording cathode ray tube displays, moreover, has also made it difficult to maintain the apparatus operating satisfactorily in service.

Accordingly, it is an object of the present invention to provide an arrangement which is simple in construction for printing a hard copy of a cathode ray tube display.

Another object of the present invention is to provide an arrangement of the foregoing character which uses the character-generating capability that is already present in cathode ray tube terminals.

A further object of the present invention is to provide a hard copy printing arrangement as described, which will reproduce alpha-numeric characters, as well as graphs, charts, tables and any other graphic configurations.

It is also an object of the present invention to provide a hard copy printing arrangement of cathode ray tube displays which is capable of recording various shades of gray.

A still further object of the present invention is to provide a printing arrangement for the reproduction of facsimile transmission and photographs.

SUMMARY OF THE INVENTION

The objects of the present invention are achieved by providing an arrangement in which a sync separator applies horizontal sync pulses to a video line counter which is reset by the vertical sync pulse. This counter identifies sequentially each line for which the amplitude of the video signal is to be digitized. This is necessary because printing is much slower than the video frame rate. A phase-lock loop is actuated by each horizontal sync pulse and provides a train of pulses which are synchronized with the horizontal sync pulse. The phase-lock loop serves to subdivide the horizontal line into intervals. The pulse outputs from the phase-lock loop are applied to a first-in-first-out shift register having a capacity equal to the number of intervals into which a horizontal line is to be subdivided.

According to the present invention, within each subdivided interval, the amplitude of the video signal is digitized into two or more levels, and the digitized data are stored in the shift register. To print, digitized data are clocked from the shift register by a voltage controlled oscillator, and the data from the shift register are then recorded on heat-sensitive paper line-by-line corresponding to the horizontal lines in a frame of the cathode ray tube display. Printing of the data is carried out in conjunction with a diode matrix which selects a particular area on the paper on which the amplitude data of a predetermined interval is to be recorded.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF THE PREFERRED EMBODIMENTS

Figure 1A:
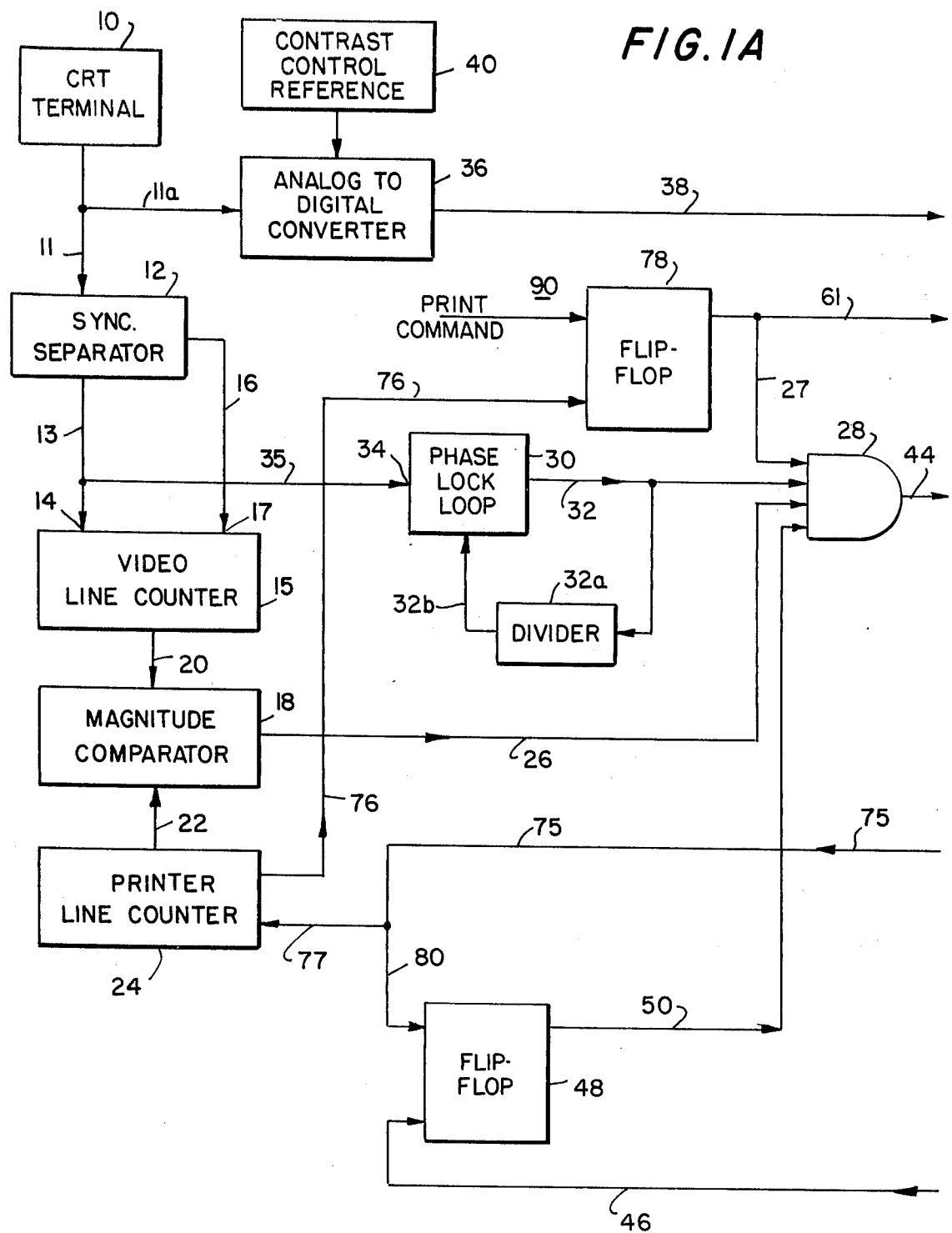
FIGS. 1A and 1B are a schematic diagram showing the essential components and their interconnections, in accordance with the present invention.

Referring to FIG. 1 of the drawings, the video signal from a cathode ray tube terminal 10 is applied via line 11 to a sync separator 12 which extracts the horizontal and vertical synchronization pulses. The sync separator 12 is a conventional circuit element found in television receivers. Counter 15 is thus advanced or incremented by one step or bit for each horizontal input pulse from the sync separator 12. The horizontal sync pulse from separator 12 is applied via line 13 to the input terminal 14 of a 264 bit capacity counter 15. The vertical sync pulse from the separator 12 is applied via line 16 to the reset terminal 17 of counter 15. Thus, the video line counter 15 receives 264 pulses per vertical frame from the sync separator 12, and is then reset by the vertical sync pulse which is applied to the reset terminal 17 at the termination of every vertical frame. Accordingly, the input 17 receives 60 pulses per second, whereas the input 14 receives 264 pulses every 1/60th of a second. With this arrangement, the video line counter 15 is always in step with the electron beam scanning the CRT of the video terminal.

The counter 15 has a 9-bit binary parallel output 20 which is applied to an input of a magnitude comparator 18. The latter has a second input which receives the output 22 of a printer line counter 24 which is advanced or incremented by one bit each time a horizontal line has been printed. The output 26 of the magnitude comparator 28 is applied to a 4-input AND gate 28. The output 26 of the magnitude comparator is designated as zero except during the time that the output 20 of the video line counter 15 equals the output 22 of the printer line counter 24. When the two counters 15 and 24 are equal, the magnitude comparator output 26 is at a high potential level. The arrangement of the counters 15 and 24 in combination with the magnitude comparator 18 determines which horizontal line is to be digitized and stored.

To subdivide each horizontal line into 256 increments, a phase-lock loop circuit 30 is provided. The latter is a conventional chip which is commercially available and has a voltage-controlled oscillator and comparator. The phase-lock loop circuit 30 provides an output clock rate which is an integral multiple of its input clock rate, as determined by divider 32a. In accordance with the embodiment of FIG. 1, the output 32 of the phase-lock loop circuit 30 provides 256 pulses for every pulse applied to its input 34 from the sync separator 12 via line 35. This is accomplished by the phase-lock loop 30 comparing the output 32b of divider 32a with the input 35 and making them equal. Consequently, the circuit element 30 functions as a frequency multiplier which provides 256 output pulses for every horizontal input pulse from the sync separator 12. The phase-lock loop circuit 30 also provides phase synchronism between input and output. Thus, the train of 256 output clock pulses is initiated with the application of the horizontal sync pulse via line 35 to the input 34 from the separator 12. The output 32 of the phase-lock loop 30 is applied to one of the four separate inputs of the AND gate 28.

The video output signal from the terminal 10 is also applied via line 11a to an analog-to-digital converter 36 having an output 38 of one or more bits representing the quantized amplitude of the video signal. The reference voltage for the analog-to-digital converter 36 is obtained from the contrast control unit 40 which sets the base line for the converter 36. If, for example, the output 38 is considered to be only of one bit in amplitude, then when the video signal is higher than the reference control voltage from the unit 40, the output 38 is a "1." If, on the other hand, the video signal is lower than the reference control voltage, the output 38 is a zero.

For every one of the 256 increments of a horizontal line, the video signal is examined by the converter 36 to determine whether the signal is higher or lower than the reference control voltage within that increment, and the result is applied to a FIFO (first-in-first-out) shift register 42. This register 42 has a 256-bit capacity, and the shifting pulses to the register 42 are applied to the input thereof from the output 44 of the AND gate 28. The output 44 of the AND gate 28 is 256 clock pulses per horizontal line of the video signal.

The precision in reproducing the video signal is determined by the number of increments into which the horizontal line is subdivided, and hence more or less than 256 increments may be employed, as desired. In each case, however, the divider 32a causes the phase-lock loop 30 to provide a number of pulses corresponding to the desired number of increments for each horizontal sync pulse applied via the input 35 to the phase-lock loop 30, and the FIFO shift register 42 has a capacity equal to the desired number of increments.

To obtain greater precision in reproducing the video signal on printed paper, furthermore, it is also possible to further quantize the amplitude of the video signal at several levels, instead of only two levels as described above. Under those conditions, the output of the converter 36 would be several bits instead of only one bit. For example, three bits at the output of the converter 36 would then provide data on eight quantized amplitude levels of the video signal. For purposes of storing the three-bit data of the output 38 from the converter 36, three FIFO shift registers, such as the unit 42, would be provided. With such further quantizing of the video signals into three binary bits, eight levels of amplitude may be obtained to provide a print gray scale.

When the FIFO shift register 42 has been filled with data, its "full" output 46 applies a reset pulse to a flip-flop 48. The output 50 of this flip-flop then goes to a low potential level that is applied to a separate input of the gate 28. As a result of this low input to the AND gate 28, no further pulses from the phase-lock loop circuit 30 can be transmitted to the FIFO shift register 42. In the illustrated embodiment, the signal output 46 from the register 42 is at a high potential level for resetting the flip-flop 48. The flip-flop 48 is set by the signal output from counter 68 via lines 71, 75 and 80, which will be described hereinafter.

Figure 2:
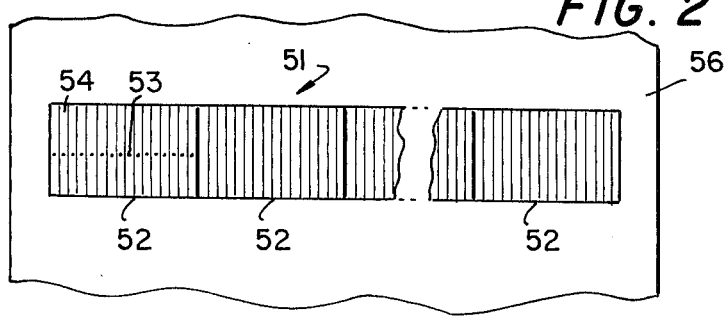
FIG. 2 is a plan view of a portion of the printing paper used in conjunction with the arrangement of FIG. 1.

To reproduce the video signal on printed paper, each data bit stored in the shift register 42 for each horizontal line is separately printed. Each line 51 (FIG. 2) to be printed on the paper 56 is, accordingly, divided into 16 main divisions 52, and each main division is further subdivided into 16 subdivisions 54. For purposes of clarification, FIG. 2 shows the main divisions 52 in heavier outline than the subdivisions 54. Each line 51 of the printed paper has, consequently, 256 subdivisions, corresponding to the data held in the 256 capacity shift register 42.

The printing paper may be a conventional heat-sensitive paper which will turn black in the area to which heat is applied, and the embodiment of FIGS. 1 and 2 is illustrated in terms of heat-sensitive paper. In the illustrated embodiment, the 256 bits of data may be recorded by 256 dots which may be spaced, for example, on 0.030-inch centers. In this manner, an entire line or row occupies approximately eight inches, so that paper of conventional width may be used. FIG. 2 shows several blackened dots 53 on the paper 56.

To print the data stored in the FIFO shift register 42, an oscillator 57 via line 59 clocks the shift register 42 so that its output 60 is applied through an AND gate 62, to a logic circuit 64. The logic circuit 64 is also actuated by clock pulses from the oscillator 57 through dividing counters 66 and 68 (in this case each with a 16-bit capacity) and their respective outputs 67 and 69. Printing head 84 is an array of semi-conductor elements on a ceramic substrate, and logic circuit 64 selectively energizes a given element to cause a blackened dot to appear on the paper where the element contacts the paper.

For convenience, the array of semi-conductor elements may be envisaged as a square 16×16 array. Counter 66 effects control over selection of a given row in the array while counter 68 controls selection of a given column in the array. The logic circuit selects the proper main division 52 and subdivision 54, taken in sequence, onto which the respective output from the register 42 is to be printed. The passing of current through a given row and a given column of the matrix, for example, causes one diode isolated dot 53 within a subdivision 54 to become hot. The heated dot results in blackening of the paper 56.

Figure 1B:
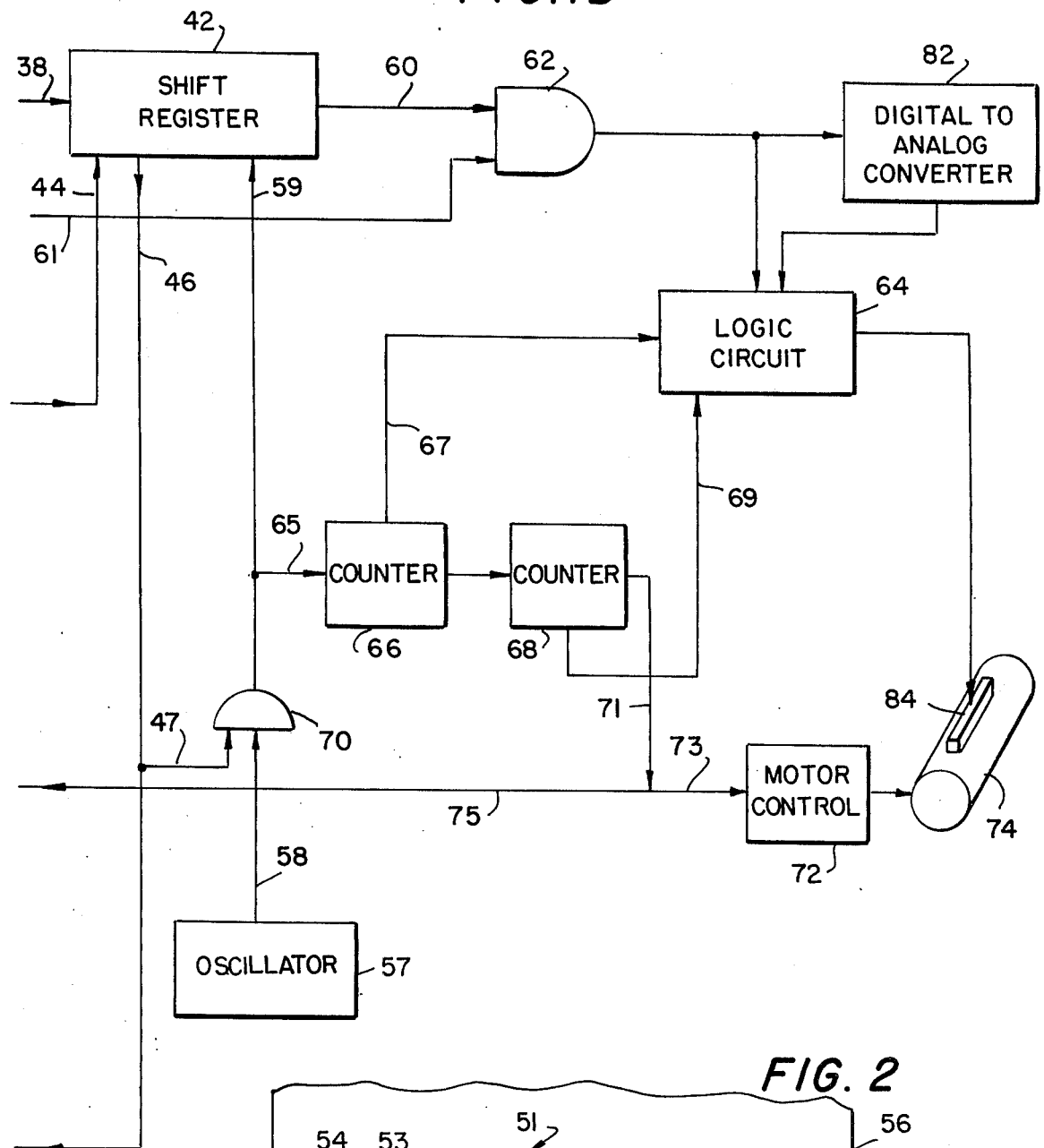

In the actual embodiment illustrated in FIGS. 1A, 1B and 2, the matrix is 256×1, instead of a matrix of 16×16, and thus the selection of a given dot for subdivision 54 requires the passing of current between one of the 16 wires (not shown) representing the respective row, and one of the 16 wires (not shown) representing the respective column of the matrix. Accordingly, 32 wires issue from the print-head array.

Approximately 100 microseconds are required for a print-head-array dot to become hot enough to discolor the paper. As a result, the printing of one video horizontal line requires approximately 25 milliseconds. Since there are 264 horizontal lines per frame, it takes approximately 8.8 seconds to print an entire CRT face plate.

If the current is applied over a longer time interval, the paper becomes darker, whereas the printed paper will be less dark if the time interval during which the current pulse is applied is reduced. For this purpose, the oscillator 57 becomes a print intensity control by adjusting its frequency or period so as to cause the current pulse duration to vary as desired. In operation, the oscillator 57 has a nominal frequency. The adjusted output 58 of the oscillator 57 is applied to an AND gate 70 and then to the FIFO shift register 42 via line 59 as well as the pair of cascaded divde-by-16 counters 66 and 68 via line 65. The FIFO register 42 has the characteristic feature that its input and output are independent. Thus, a bit of data inserted into the FIFO register 42 by the line 38 is ready to be delivered to the output line 60 when the input of the register 42 is pulsed by line 59 from the oscillator 57. The AND gate 70 inhibits pulses from the oscillator 57 to the register 42 until the latter is filled, at which time a "full" signal is applied to gate 70 via lines 46 and 47.

As the digitized video bits are taken from the register 42 in synchronism with the oscillator 57, the row and column select inputs of the divide-by-16 counters 66 and 68 cause each of these bits from the register 42 to be delivered to the appropriate print-head-array dot. When a bit is a zero, the paper remains unaffected. If, on the other hand, a bit is a "1," then the respective dot receives a current pulse which heats the paper and causes, in turn, blackening of the respective area of the paper. When 256 bits have been applied to the print-matrix selector 64, then the counter 68 applies a high logic signal via lines 71 and 73 to the motor control unit 72 for the purpose of the advancing the paper by one line. Accordingly, when the contents of the register 42 have been emptied, the paper is advanced by means of the motor 74 controlled by the unit 72. Simultaneous with the advancing of the paper, the dividing counter 68 also increments the printer line counter 24 via lines 75 and 77 so as to permit the next horizontal line of the video signal to be digitized and applied to the FIFO register 42, and sets the flip-flop 48 via lines 71, 75 and 80.

When the last line of a frame has been printed, the counter 24 applies a reset pulse via line 76 to the print command flip-flop 78. The resetting of this flip-flop 78 is transmitted to the AND gate 28 via line 27, which inhibits further transmission of pulses from the AND gate 28 at its output. The resetting of flip-flop 78 is also transmitted to the AND gate 62, via line 61, which prevents further signals from flowing through gate 62. The system is thus in an inoperative state until the flip-flop 78 becomes set again by applying a print command signal 90 to its input. The print command signal 90 is an ON-OFF switch that may be manually operated. When the print command signal 90 is applied to the flip-flop 78, the flip-flop 78 is set and the output signals 27 and 61 are applied to gates 28 and 62 to instruct the gates of the change of state of flip-flop 78.

If, on the other hand, it is desired to print from a high resolution cathode ray tube, e.g., having a band width of 10 mHz, then the horizontal digitization needs to be, for example, 512 bits long. Also, if interlaced scanning is required with 525 horizontal lines, for example, then the printing time is increased proportionately to approximately 35 seconds. Clearly, the image on the cathode ray tube must be held steady during the entire printing time. The modification of the components for the purpose of subdividing each horizontal line into 512 bits to obtain higher resolution has already been described above.

Figure 3:
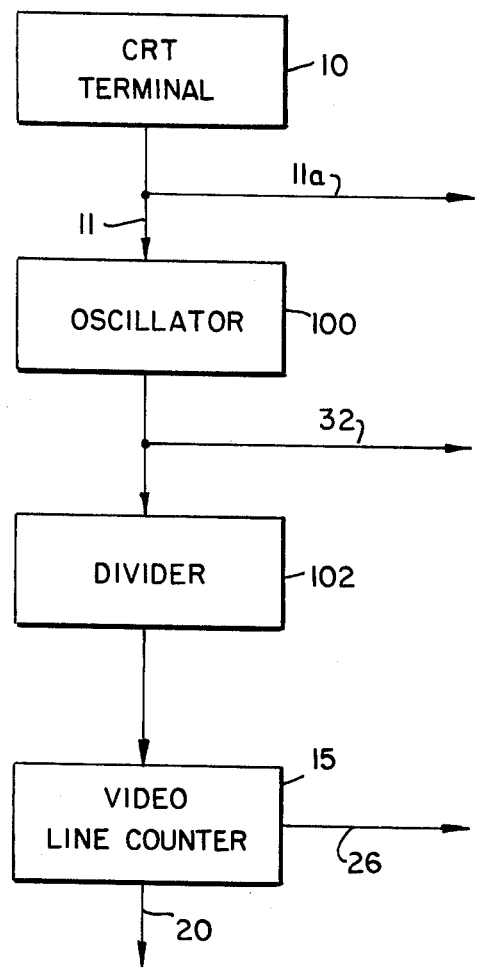
FIG. 3 is a schematic diagram of an alternative embodiment of the invention.

An alternate implementation may be required in order to achieve interlace scanned printing. Such implementation is shown in FIG. 3. In this implementation, the sync separator 12, phase lock loop 30 and divider 32a are replaced by crystal oscillator 100 and divider 102. The video signal from the CRT terminal 10 is applied via line 11 to the oscillator 100, and is also applied to the analog-to-digital converter 36 (not shown) via line 11a as in FIG. 1A. The crystal oscillator 100 is locked onto the cathode ray tube terminal horizontal frequency using standard techniques. Its frequency is determined by the product of the number of horizontal lines x the number of frames per second x the horizontal digitization. As an example, in a standard television set, the number of horizontal lines is 525 and the number of frames per second is 30. Using 256 as the horizontal digitization, the frequency of the oscillator 100 would then be 525×30×256, which is 4.032 mHz. The output of divider 102 is the horizontal line frequency of 15,750 Hz and goes into the video line counter 15. The outputs 20 and 26 of the counter 15 are applied as in FIG. 1A. The output of the crystal oscillator, 100, feeds via line 32 into the four input AND gate 28 (not shown) as in FIG. 1A. The use of a crystal oscillator has the additional benefit of reducing horizontal jitter which might arise from slight timing errors in the phase-lock loop and logic circuits. The result of this feature would be to cause slight horizontal displacements of the printed horizontal lines.

When the video signal is digitized so that only one bit of data is provided by the output of the converter 36, the printer will print only in terms of black and white. Shades of gray, on the other hand, may be printed when digitizing the video signal into several levels, e.g., eight levels whereby three bits are subdivided at the output of the converter 36. If these three bits of data are stored in FIFO registers which are 3 by 256 instead of 1 by 256, then eight shades of gray may be stored ranging from pure white, represented by a zero, to pure black, represented by a 7, for example. When printing takes place, three bits are shifted at a time out of the FIFO register instead of one bit, and these are reconverted into an analog signal by a digital-to-analog converter 82 which may be made part of the printer-matrix circuit. The analog signal from the output of the converter 82 is converted into a current pulse of either variable amplitude or width to heat up the properly-selected print-head-array dot so as to result in the respective shade of gray.

The transfer characteristics of the paper and print-head-array dot, i.e., the blackness of the dot as a function of current (called gamma in photographic parlance) can be accounted for by making the digital-to-analog converter 32 non-linear and matching the "gamma" curve of the thermal paper 56.

The logic circuit 64 and printing head 84 are well known in the art. The print-head in conjunction with the stepping motor 74 for advancing the heat-sensitive paper is also conventional. While any desired logic circuits and printing heads may be employed, it is preferred to use the thermal printing heads of the type shown in Aiken U.S. Pat. Nos. 3,815,144 and 3,964,061, which incorporate an array of individually energizable heat-producing elements formed in a substrate and means responsive to a digital number for energizing a selected element. The Aiken patents are incorporated herein by reference thereto.

Figure 4:
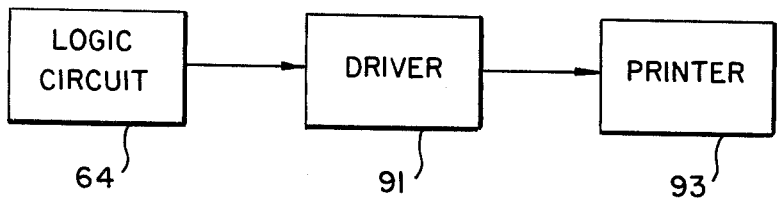
FIG. 4 is a schematic diagram for recording the CRT display on other mediums, such as electrostatic paper.

FIG. 4 is a schematic diagram of the means for recording the CRT display on any other desired recording medium, such as electrostatic paper or the like. In such a case, the output from logic circuit 64 is applied to driver 91, and the appropriate signal therefrom activates the desired element in printer 92. Where electrostatic recording media are employed, the driver 91 will be a voltage amplifier so that voltage signals will be applied via printer 92 to create an electrostatic latent image that is subsequently developed to a permanent visible image. In such a case, printer 92 will include an array of voltage-producing elements. Where magnetic or current-sensitive recording media are used, then driver 91 will be a current amplifier and printer 92 will be an array of resistors or other current-responsive elements.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

What is claimed is:

1. An arrangement for making a recording of an image displayed on a cathode ray tube for a selected substantially short duration of time, comprising line identifying means for identifying and recording sequentially a horizontal line of an image on said cathode ray tube to be recorded; dividing means connected to said line identifying means for dividing said horizontal line into a predetermined number of intervals; means for digitizing the amplitude of a video signal corresponding to said horizontal line within each of said intervals; storage means connected to said amplitude digitizing means and to said dividing means for storing digitized amplitudes within each interval; recording means connected to said storage means for recording within a predetermined time duration the digitized amplitudes transmitted from said storage means; said line identifying means comprises sync separator means for receiving said video signal and for generating horizontal sync pulses and vertical sync pulses, first counter means connected to said sync separator means and operable to be advanced by said horizontal sync pulses and to be reset by said vertical sync pulses, second counter means connected to said recording means and advanced by pulses from said recording means; and magnitude comparator means having inputs connected to said first counter means and said second counter means for comparing the contents of said first and second counter means, said magnitude comparator means having an output for controlling said storage means.

2. An arrangement according to claim 1, wherein said recording means comprises means for establishing an electrostatic latent image on a recording medium, and means for developing said latent image to a permanent visible image.

3. An arrangement according to claim 1, wherein said storage means comprises a first-in-first-out shift register receiving shift pulses from said dividing means when the output of said magnitude comparator means has a predetermined state; said dividing means comprising phase-lock loop circuit means receiving horizontal sync pulses from said sync separator means and having an output of a predetermined number of pulses for each horizontal syncpulse, the output of said phase-lock loop circuit means being in phase synchronism with the input horizontal sync pulse; an AND gate having four inputs, a first input of said gate being connected to said output of said phase-lock loop circuit means, a second input of said gate being connected to the output of said magnitude comparator means; first bistable switching means for controlling the on-off operation of said recording means and having an output connected to a third input of said gate means; a second bistable switching means having an output connected to a fourth input of said gate means for inhibiting digitized amplitudes to be applied to said storage means when said storage means has been filled, said gate means having an output connected to said storage means for shifting said storage means only when all four inputs have predetermined states; oscillator means with adjustable pulse frequency connected to said storage means for actuating said storage means to transmit the digitized amplitudes to said recording means sequentially; said recording means comprises heat-sensitive paper and an array of individually energizable heat-producing elements, said elements being energized to record along a line on said paper the digitized amplitudes of a horizontal line of said video signal; said means for digitizing the amplitude of said video signal comprises analog-to-digital converter means, the amplitudes of a video signal corresponding to a horizontal line being digitized at a plurality of levels; and auxiliary digital-to-analog converter means for converting the multi-level digitized amplitude into corresponding analog signals for applying a corresponding gray color to said paper.

4. An arrangement according to claim 1, wherein said recording means comprises heat-sensitive paper and an array of individually energizable heat-producing elements, said elements being energized to record along a line on said paper the digitized amplitudes of a horizontal line of said video signal.

5. An arrangement according to claim 4, wherein said dividing means divides each of said horizontal lines into 256 intervals, and said array includes 256 elements for recording the digitized amplitudes within each of said intervals.

6. An arrangement according to claim 4, wherein said means for digitizing the amplitude of said video signal comprises analog-to-digital converter means, the amplitudes of a video signal corresponding to a horizontal line being digitized at a plurality of levels.

7. An arrangement according to claim 6, wherein eight levels are recorded on said paper with gray color intensity from pure black to pure white.

8. An arrangement according to claim 6, including auxiliary digital-to-analog converter means for converting the multi-level digitized amplitude into corresponding analog signals for applying a corresponding gray color to said paper.

9. An arrangement according to claim 1, wherein said storage means comprises a first-in-first-out shift register receiving shifting pulses from said dividing means when the output of said magnitude comparator means has a predetermined state.

10. An arrangement according to claim 9, wherein said dividing means comprises phase-lock loop circuit means receiving horizontal sync pulses from said sync separator means and having an output of a predetermined number of pulses for each horizontal sync pulse, the output of said phase-lock loop circuit means being in phase synchronism with the input horizontal sync pulse.

11. An arrangement according to claim 10, including an AND gate having four inputs, a first input of said gate being connected to said output of said phase-lock loop circuit means, a second input of said gate being connected to the output of said magnitude comparator means, first bistable switching means for controlling the on-off operation of said recording means and having an output connected to a third input of said gate means; and a second bistable switching means having an output connected to a fourth input of said gate means for inhibiting digitized amplitudes to be applied to said storage means when said storage means has been filled, said gate means having an output connected to said storage means for shifting said storage means only when all four inputs have predetermined states.

12. An arrangement according to claim 11, including oscillator means with adjustable pulse frequency connected to said storage means for actuating said storage means to transmit the digitized amplitudes to said recording means sequentially.

* * * * *